United States Patent [19]
Umemoto et al.

[11] Patent Number: 5,771,464
[45] Date of Patent: Jun. 23, 1998

[54] RADIO COMMUNICATION APPARATUS FOR USE IN DUAL-MODE RADIO COMMUNICATION SYSTEM AND HAVING GAIN VARIABLE CONTROL MEANS DEPENDENT ON THE SET MODE

[75] Inventors: Yuji Umemoto; Yoshiro Yoshimura, both of Tokyo, Japan

[73] Assignee: Kabushiki Kaisha Toshiba, Kawasaki, Japan

[21] Appl. No.: 527,009

[22] Filed: Sep. 12, 1995

[30] Foreign Application Priority Data

Sep. 13, 1994 [JP] Japan .................................. 6-218580

[51] Int. Cl.[6] .................................................. H04B 1/40
[52] U.S. Cl. ...................... 455/553; 455/569; 455/200.1; 381/107
[58] Field of Search .......................... 455/89, 33.1, 33.2, 455/84, 54.1, 54.2, 56.1, 200.1, 553, 552, 569, 570, 524; 381/107

[56] References Cited

U.S. PATENT DOCUMENTS

| | | | |
|---|---|---|---|
| 4,363,001 | 12/1982 | Suzuki et al. ........................ | 455/233.1 |
| 4,987,599 | 1/1991 | Most et al. .............................. | 381/107 |
| 5,428,664 | 6/1995 | Kobayashi ................................ | 455/89 |
| 5,450,618 | 9/1995 | Naddell et al. ........................... | 455/89 |
| 5,493,693 | 2/1996 | Tanaka et al. ............................ | 455/89 |
| 5,550,893 | 8/1996 | Heidari .................................... | 455/553 |

*Primary Examiner*—Edward F. Urban
*Attorney, Agent, or Firm*—Finnegan, Henderson, Farabow, Garrett & Dunner, L.L.P.

[57] ABSTRACT

A dual mode radio communication apparatus according to the invention has a reception speech signal output circuit for processing an analog demodulation signal in an analog mode and a digital demodulation signal in a digital mode by means of a common signal processing circuit, thereby outputting reception speech signals, respectively. In the dual mode radio communication apparatus, a level variable circuit is provided across a signal path extending between a demodulated signal input terminal of a reception speech signal output circuit and a speaker. The level variable circuit determines whether the analog mode or the digital mode is set as the radio communication mode. If the analog mode is set, the gain of the level variable circuit is set to a first value for compensating for a level deviation in the analog demodulation signal. If the digital mode is set, the gain of the level variable circuit is set to a second value for preventing excessive suppression of the digital demodulation signal.

19 Claims, 6 Drawing Sheets

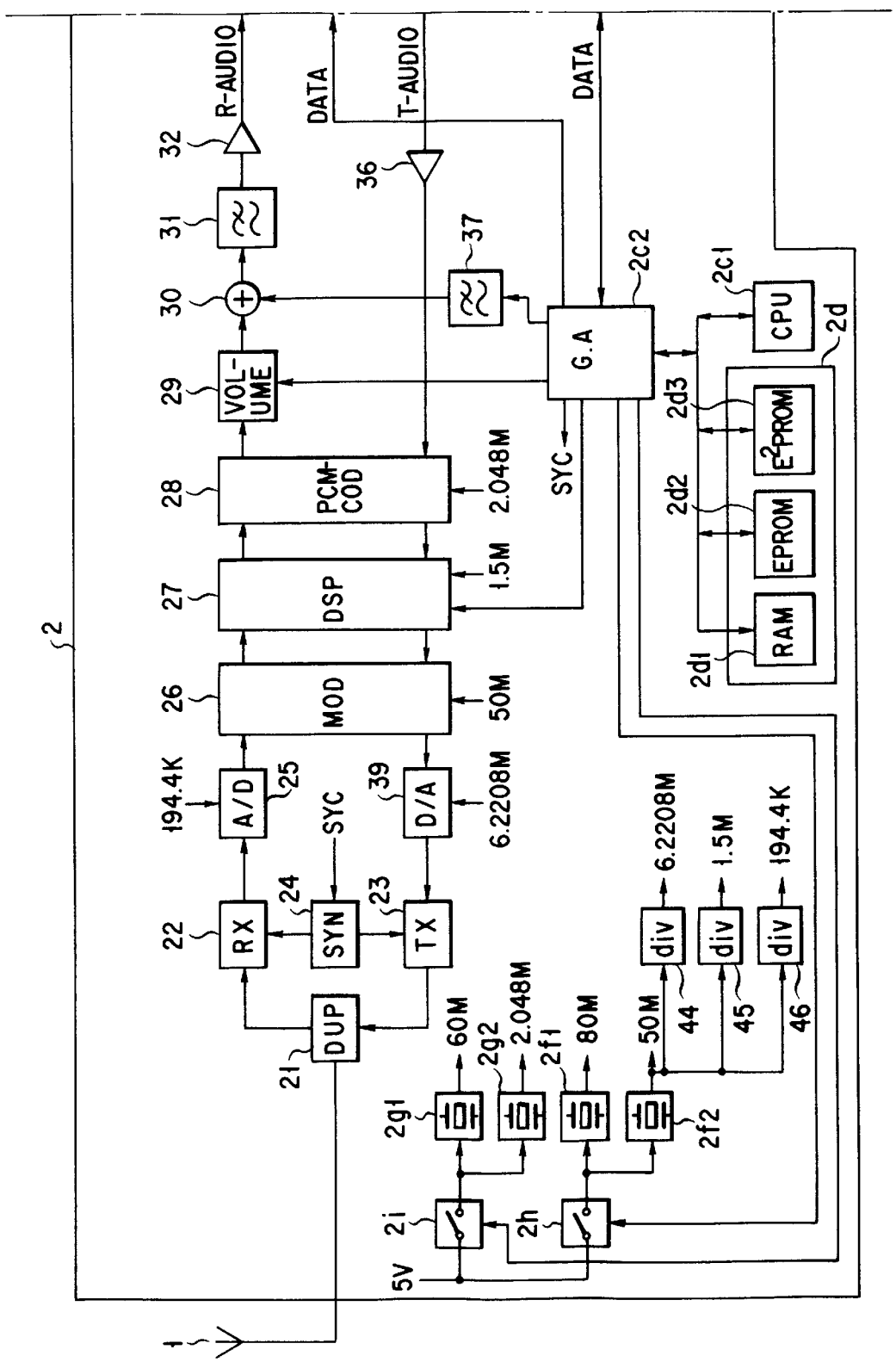
F I G. 2A

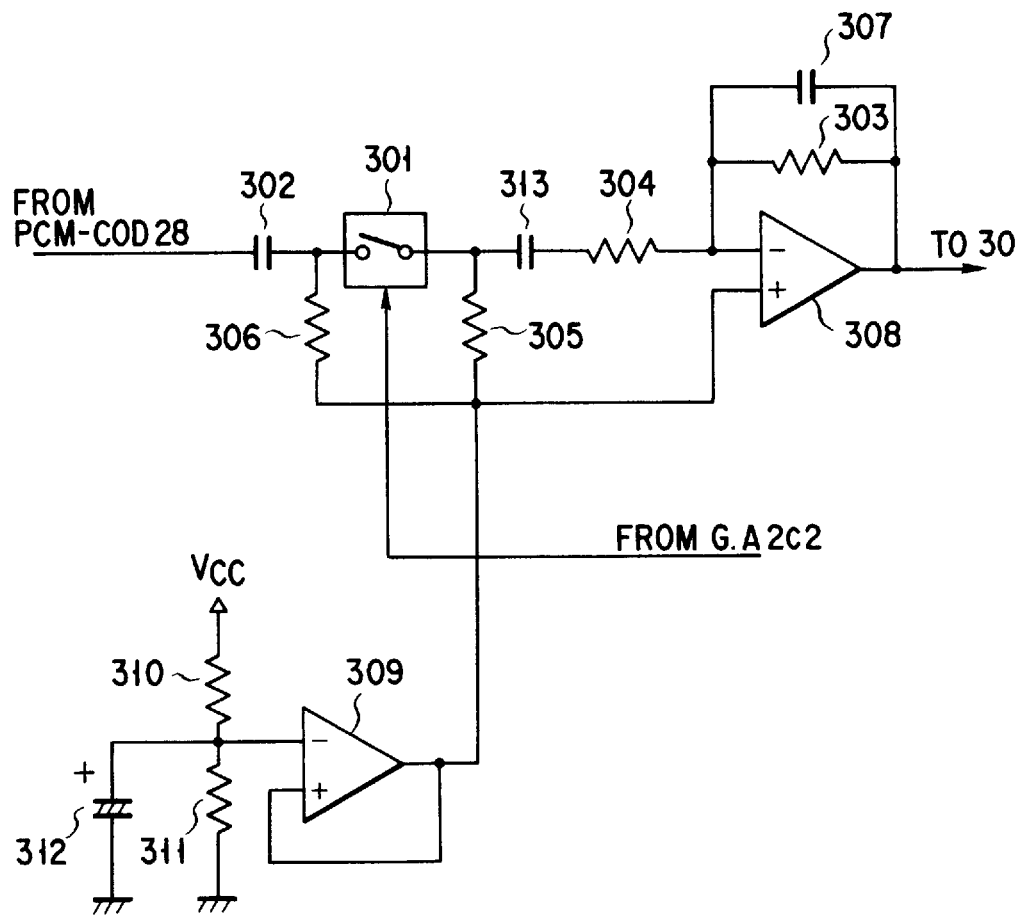
F I G. 3

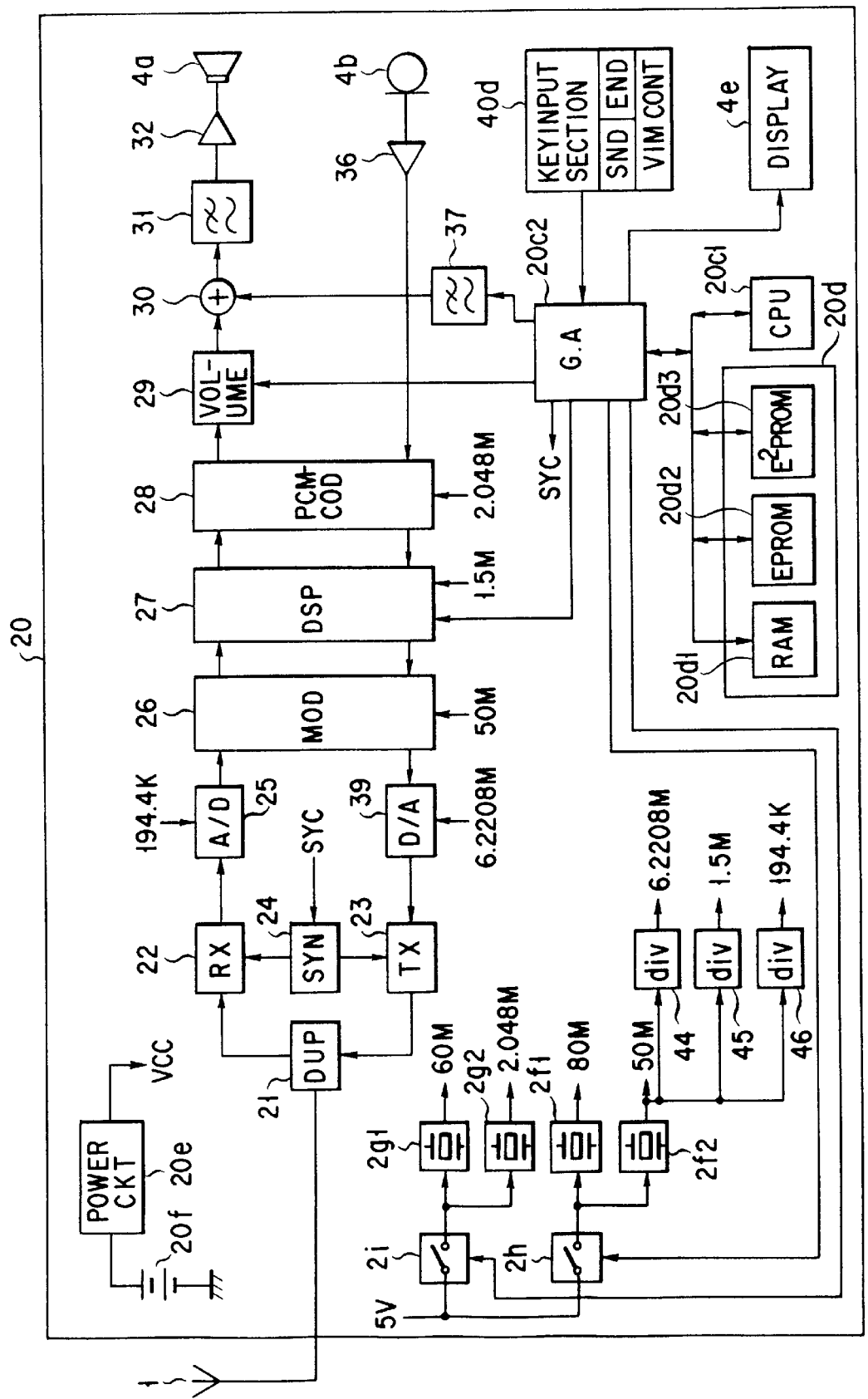
F I G. 5

RADIO COMMUNICATION APPARATUS FOR USE IN DUAL-MODE RADIO COMMUNICATION SYSTEM AND HAVING GAIN VARIABLE CONTROL MEANS DEPENDENT ON THE SET MODE

BACKGROUND OF THE INVENTION

1. Field of the Invention

This invention relates to a radio communication apparatus such as a mobile telephone, a portable telephone, a cordless telephone, etc., and more particularly to a radio communication apparatus for use in a dual-mode radio communication system, which selectively uses an analog mode and a digital mode to radio a communication signal between a base station and a mobile unit.

2. Description of the Related Art

A dual-mode radio communication system has been proposed as one type of movable radio communication system. The dual mode system means a system which uses both analog mode and digital mode.

The analog mode is a mode where a transmitter apparatus transmits a carrier wave whose frequency, for example, is modulated using an analog speech signal and data, and a receiver apparatus receives and demodulates the frequency modulated wave to reproduce the analog speech signal and the data.

On the other hand, the digital mode is a mode where the transmitter apparatus encodes a speech signal and data and transmits a carrier wave digitally modulated by a π/4 shifted DQPSK (π/4 shifted Differentially Encoded Quadrature Phase Shift Keying) system with the use of the encoded signal and data, and the receiver apparatus receives and digitally demodulates the modulated wave, thereby decoding the demodulated wave to reproduce the speech signal and data.

Among radio communication apparatuses for use in a dual-mode radio communication system of this type, an apparatus has been proposed which enables a single signal transmission line to be used in both the analog mode and the digital mode by means of a DSP (Digital Signal Processor).

In this proposed apparatus, a modulated carrier wave signal received by an antenna is input to a receiving circuit which is provided with a frequency conversion circuit and a discriminator. The frequency conversion circuit converts the modulated carrier wave signal to an intermediate frequency signal by frequency conversion. The discriminator performs FM demodulation of the intermediate frequency signal received in the analog mode. The signal output from the receiving circuit is input to the DSP via a digital demodulation circuit in both the digital mode and the analog mode.

The digital demodulation circuit performs, in the digital mode, digital demodulation of the received signal to output a digital demodulation signal. On the other hand, in the analog mode, the digital demodulation circuit only converts the received signal to a digital signal, and outputs the digital signal without demodulating the same. In the digital mode, the above-mentioned DSP performs error correction decoding and speech decoding of the digital demodulation signal, and supplies an outputs signal to a PCM decoding circuit. In the analog mode, the DSP supplies the digital reception signal directly to the PCM decoding circuit without decoding the same. The PCM decoding circuit converts the digital reception signal supplied from the DSP to an analog reception signal. The analog reception signal output from the PCM decoding circuit is amplified by a reception signal amplifier, and then output from a speaker.

Since in the apparatus constructed as above, a single signal line is used in both the analog mode and the digital mode, the apparatus can be made more simple in structure and compact than an apparatus which uses two signal lines in the analog mode and the digital mode, respectively.

The apparatus using a single signal line, however, has the following disadvantage:

In the analog mode, FM demodulation by the discriminator causes different reception signal levels in different apparatuses. To compensate for level deviation, it is considered to provide a level-adjusting volume, for example, at the output terminal of the PCM decoding circuit. However, the volume will adversely affect the apparatus in the digital mode. Specifically, since in the digital mode, the discriminator does not perform FM demodulation, the level of the reception signal is substantially constant between different apparatuses. If the volume compensates for the reception signal level in the digital mode in the same manner as in the analog mode, the reception signal level becomes an erroneous level.

SUMMARY OF THE INVENTION

It is the object of the invention to provide a radio communication apparatus capable of obtaining an optimal reception signal level in both the analog mode and the digital mode, thereby enhancing the quality of a reception speech.

To attain the object, there is provided a dual mode radio communication apparatus which has a reception speech signal output means for processing an analog demodulation signal in an analog mode and a digital demodulation signal in a digital mode by means of a common signal processing circuit, thereby outputting reception speech signals, respectively, wherein level variable means is provided across a signal path extending between a demodulated signal input terminal of a reception speech signal output means and a speaker. The level variable means determines whether the analog mode or the digital mode is set as the radio communication mode. If the analog mode is set, the gain of the level variable means is set to a first value for compensating for a level deviation in the analog demodulation signal. If the digital mode is set, the gain of the level variable means is set to a second value for preventing excessive suppression of the digital demodulation signal.

By virtue of the above structure, a level deviation in a demodulation signal, caused as a result of FM demodulation by the discriminator in the analog mode, is compensated for by the level variable means. Therefore, in the analog mode, a reception speech of an optimal volume, whose level deviation is compensated for, is output. On the other hand, in the digital mode, the gain of the level variable means is set to the preset standard second value. Therefore, the reception signal reproduced in the digital mode is output from the speaker without unnecessary level control by the level variable means. Thus, also in the digital mode, a reception speech of an optimal volume is output.

As described above, in either the analog mode or the digital mode, a reception speech of an optimal volume and a high quality, which is free from the influence of FM demodulation by the discriminator upon the level of the demodulation signal can be obtained.

Moreover, since the gain of the level variable means is automatically varied depending upon whether the analog mode or the digital mode is set, it is not necessary for the user to vary the gain in accordance with the mode by manual operation. This means that the apparatus has high operability.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 2A and 2B are block diagrams, showing a detailed structure of the apparatus of FIG. 1;

FIG. 3 is a circuit diagram, showing a detailed structure of a volume appearing in FIG. 2A;

FIG. 5 is a block diagram, showing a dual mode portable telephone apparatus according to a second embodiment of the invention.

DETAILED DESCRIPTION OF THE PREFERRED EMBODIMENTS (First Embodiment)

This embodiment is an example of a dual mode mobile telephone apparatus having a hand set speech function and a hand free speech function, to which the invention is applied.

Figure 1:
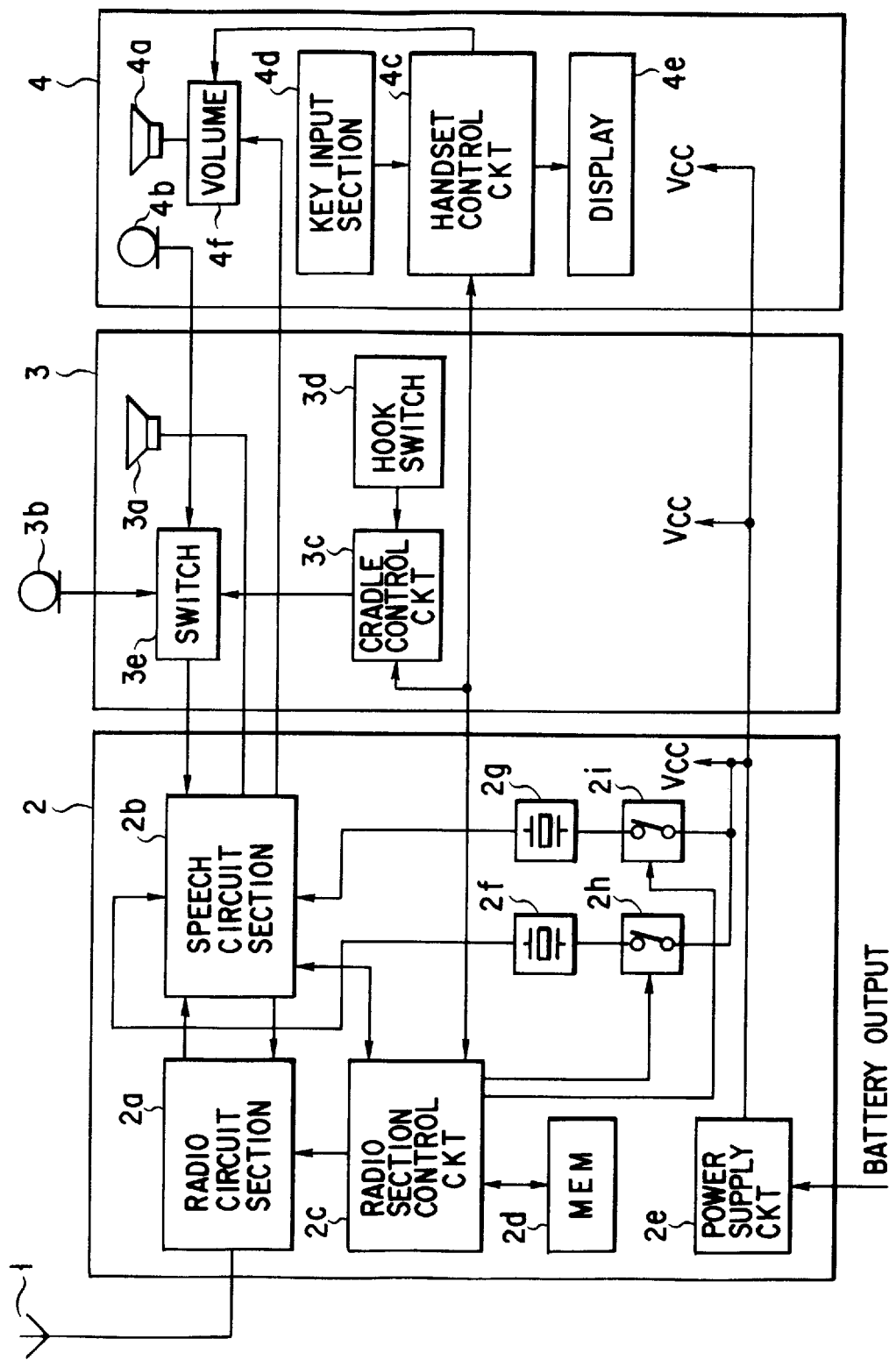
FIG. 1 is a schematic block diagram, showing a dual mode mobile telephone apparatus according to a first embodiment of the invention.

FIG. 1 is a schematic block diagram, showing the dual mode mobile telephone apparatus according to the first embodiment.

As is shown in FIG. 1, the apparatus comprises an antenna 1, a radio unit 2, a cradle 3, and a hand set 4. The antenna 1 is constituted, for example, by a rod antenna, and attached to an outer surface of a vehicle. The radio unit 2 is installed, for example, in the trunk of the vehicle, and connected to the antenna 1 via a coaxial cable. The cradle 3 is installed, for example, in an arm rest unit in the vehicle, and connected to the radio unit 2 by means of a cable which is formed by stranding a signal line, a control line and a power supply line. The hand set 4 is detachably placed on the cradle 3, and connected thereto by means of a curl cord which is formed by stranding a signal line, a control line and a power supply line.

The radio unit 2 contains a radio circuit section 2a, a speech circuit section 2b, a radio unit control circuit 2c, a memory circuit (MEM) 2d storing data necessary for the control, a power supply circuit 2e, oscillators 2f and 2g, and switches 2h and 2i. The oscillators 2f and 2g supply the speech circuit section 2b with necessary clock signals, etc. The switches 2h and 2i are closed in the digital mode and the analog mode, respectively, and supply the oscillators 2f and 2g with a power voltage, respectively, to oscillate them. The power supply circuit 2e generates a predetermined operation power voltage Vcc on the basis of an output from a vehicle battery (not shown).

The cradle 3 has a speaker 3a for had free speech (hereinafter referred to as "hand free speaker"), a microphone 3b for hand free speech (hereinafter referred to as "hand free microphone"), a cradle control circuit 3c and a hook switch 3d.

The hand set 4 has a speaker 4a for hand set speech (hereinafter referred to as "hand set speaker"), a microphone 4b for hand set speech (hereinafter referred to as "hand set microphone"), a hand set control circuit 4c, a key input section 4d, a display unit 4e, and a hand set volume 4f. The key input section 4d has function keys such as a dial key, an SND key, an END key, etc. The SND key is used to input an instruction to send a signal at the time of sending it, and is used to input a response to a reception signal at the time of receiving the same. The END key is used to indicate the termination of speech. The display unit 4e consists, for example, of a liquid crystal display unit, and is used to display various data relating to a dial number, a communication operation, etc.

Figure 2B:
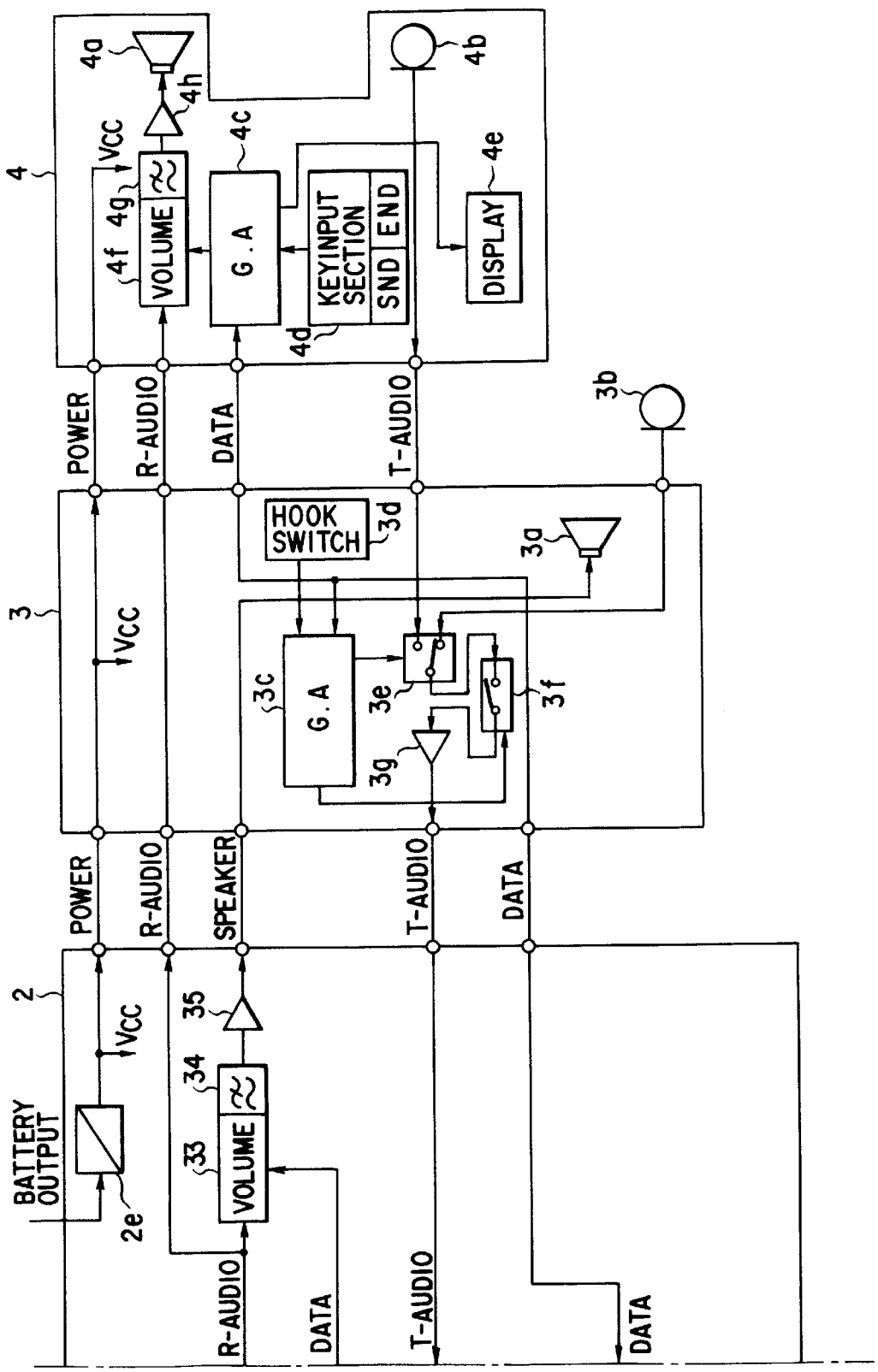

FIGS. 2A and 2B are block diagrams, showing a detailed structure of each of the radio unit 2, the cradle 3 and the hand set 4.

A radio carrier wave signal transmitted from a base station (not shown) via a predetermined radio channel is received by the antenna 1, and then input to a receiving circuit (RX) 22 via an antenna shared unit (DUP) 21. The receiving circuit 22 mixes the received carrier wave signal with a receiving station oscillation signal output from a frequency synthesizer (SYN) 24, thereby converting the carrier wave signal to an intermediate frequency signal. The frequency of the receiving station oscillation signal generated from the frequency synthesizer 24 is controlled by a control signal SYC output from a gate array 2c2 which will be explained later. The receiving circuit 22 has the discriminator which performs FM demodulation of the received intermediate frequency signal in the analog mode.

The received intermediate frequency signal or the FM demodulated signal output form the receiving circuit 22 is sampled by an A/D converter 25, and then input to a digital modulation/demodulation circuit (MOD) 26. The MOD 26 digitally demodulates, in the digital mode, the received intermediate frequency signal to a received digital base band signal, and supplies the digital base band signal to a DSP 27. On the other hand, in the analog mode, the MOD 26 directly supplies the FM demodulated signal to the DSP 27.

The DSP 27 has a function for performing error correction encoding/decoding, and a function for performing speech encoding/decoding. In the digital mode, the DSP 27 subjects the received digital base band signal to error correction decoding and to speech decoding, thereby supplying the thus-obtained digital demodulated signal to a PCM encoding/decoding circuit (PCM-COD) 28. In the analog mode, the DSP 27 directly supplies the FM demodulated signal to the PCM encoding/decoding (PCM-COD) 28.

The PCM-COD 28 converts the digital reception signal and the FM demodulated signal to analog reception signals, and supplies the analog reception signals to a volume 29. The volume 29 is provided for compensating for a level deviation in a signal FM-demodulated by the discriminator. In the analog mode, the volume 29 attenuates the analog reception signal. The amount of attenuation is controlled by a CPU 2c1, which will be explained later, such that it differs between the analog mode and the digital mode.

The analog reception signal output from the volume 29 is input to an adder 30, where an alert sound signal, for example, is superposed upon the analog reception signal. The alert sound signal is generated by passing the digital reception signal output from the control gate array 2c2 in accordance with the instruction of a CPU 2c1, through a low pass filter 37 to remove its high frequency component. During output of the alert sound signal, the CPU 2c1 causes the control gate array 2c2 to output a gain control signal, thereby setting the amount of attenuation of the volume 29 to a maximum value. As a result, a signal-receiving line between the PCM-COD 28 and the adder 30 is interrupted.

The analog reception signal output from the adder 30 is passed through the low pass filter 31, thereby removing a chopper frequency component contained in the analog reception signal. The chopper frequency component is generated by the volume 29, and has a frequency of e.g.100 kHz which is sufficiently higher than a speech band frequency. This being so, removal of the chopper frequency component will not degrade the quality of a reception speech.

Each of the analog reception signal and the alert sound signal having passed through the low pass filter 31 is divided into two portions after they pass through a buffer amplifier 32. One of the divided portions of each of the analog reception signal and the alert sound signal is supplied to the hand set 4 via the cradle 3. In the hand set 4, the analog reception signal and the alert sound signal are first input to the hand set volume 4f. The hand set volume 4f is responsive to a sound volume adjusting operation of the user at the time of the hand set speech for attenuating the analog reception signal and the alert sound signal. The amount of attenuation is set by a gain control signal output from the gate array 4c. The attenuated analog reception signal and alert sound signal are supplied to the hand set speaker 4a via a low pass filter 4g and a reception amplifier 4h, and are output therefrom. At the time of the hand free speech, the maximum amount of attenuation is set at the hand set volume 4f, with the result that supply of the analog reception signal and the alert sound signal to the hand set speaker 4a is interrupted.

On the other hand, the other portion of each of the analog reception signal and the alert sound signal is input to a hand free volume 33. The hand free volume 33 is responsive to a sound volume adjusting operation of the user at the time of the hand free speech for attenuating the analog reception signal and the alert sound signal. The amount of attenuation is set by a gain control signal output from the gate array 2c2. The attenuated analog reception signal and alert sound signal are supplied to the hand free speaker 3a via a low pass filter 34 and an amplifier 35, and are output therefrom. At the time of the hand free speech, the maximum amount of attenuation is set at the hand free volume 4f, with the result that supply of the analog reception signal and the alert sound signal to the hand free speaker 3a is interrupted.

A hand set transmission speech signal output from the hand set microphone 4b is input to a switch 3e incorporated in the cradle 3. The switch 3e also receives a hand free transmission speech signal output from the hand free microphone 3b of the cradle 3. The switch 3e is switched by the gate array 3c such that it outputs the hand set transmission speech signal at the time of hand set speech, and outputs the hand free transmission speech signal at the time of hand free speech. It is determined by the gate array 3c in accordance with the state of the hook switch 3d whether the apparatus is in the hand set speech state or in the hand free speech state. Specifically, where the hook switch 3d is in the off-hook state which indicates that the hand set 4 is raised from the cradle 3, it is determined that the apparatus is in the hand set speech state. On the other hand, where the hook switch 3d is in the on-hook state which indicates that the hand set 4 is placed on the cradle 3, it is determined that the apparatus is in the hand free speech state. The transmission speech signal output from the switch 3e is input to the radio unit 2 via the switch 3f and the buffer amplifier 3g.

In the radio unit 2, the transmission speech signal is input to the PCM-COD 28 via a buffer amplifier 36, where the signal is converted to a digital signal. The digital signal is input to the DSP 27. In the digital mode, the DSP 27 subjects the digital transmission signal to error correction encoding and to speech encoding. In the analog mode, the DSP 27 passes the digital transmission signal therethrough without processing the same. The digital transmission signal output from the DSP 27 is input to the MOD 26. The MOD 26 generates, in the digital mode, an intermediate frequency signal digitally modulated by the digital transmission signal, and passes the digital transmission signal therethrough in the analog mode.

The modulated wave signal and the digital transmission signal output from the MOD 26 are converted to analog signals by a D/A converter 39, and then input to a transmission circuit (TX) 23. In the digital mode, the transmission circuit 23 mixes the modulated wave signal with a transmitter oscillation signal output from the frequency synthesizer 24, thereby generating a radio carrier wave signal. In the analog mode, the transmission circuit 23 modulates the frequency of the intermediate frequency signal by means of the input transmission signal, and mixes the modulated wave signal with the transmitter oscillation signal output from the frequency synthesizer 24, thereby generating a radio carrier wave signal. Further, the transmission circuit 23 amplifies the radio carrier wave signal to a predetermined transmission power level. The radio carrier wave signal output from the transmission circuit 23 is transmitted to the antenna 1 via the antenna shared unit 21, and then transmitted from the antenna 1 to a base station (not shown).

The memory circuit 2d has a RAM 2d1, an EPROM 2d2 and an $E^2$PROM 2d3. The RAM 2d1 temporarily stores various data necessary to control. The EPROM 2d2 prestores control programs, etc. The $E^2$PROM 2d3 stores the telephone numbers of destinations which are necessary to perform shortened dialing, and further prestores attenuation amount-setting data for setting the amounts of attenuation of the volume 29 in both the analog mode and the digital mode. The amount of attenuation in the analog mode is predetermined in each apparatus so that optimal level compensation can be performed in accordance with the modulation sensitivity characteristics of a discriminator employed in the apparatus. The attenuation amount in the digital mode is set to a minimum value (e.g. zero).

The CPU 2c1 determines during communication whether the present mode is the analog mode or the digital mode. If the present mode is determined to be the analog mode, the CPU 2c1 reads the attenuation amount-setting data for the analog mode from the $E^2$PROM 2d3, and transmits the read data to the gate array 2c2. On the other hand, if the present mode is determined to be the digital mode, the CPU 2c1 reads the attenuation amount-setting data for the digital mode from the $E^2$PROM 2d3, and transmits the read data to the gate array 2c2. The gate array 2c2 supplies the volume 29 with a gain control signal corresponding to the transmitted attenuation amount-setting data. Thus, the attenuation amount of the volume 29 is varied.

FIG. 3 is a circuit diagram, showing the volume 29. As is shown in FIG. 3, the volume 29 has a gate switch 301, which is turned on and off by a chopper frequency of 100 kHz output from the gate array 2c2 to attenuate the volume 29. The amount of attenuation is determined by varying the duty cycle of the on off operation.

Specifically, an analog reception signal output from the PCM-COD 28 is input to the gate switch 301 via a coupling capacitor 302, and attenuated as a result of switching of the switch 301. The attenuated analog reception signal output from the gate switch 301 is input to a low pass filter constituted by an operational amplifier 308, a capacitor 307 connected to an input terminal of the amplifier 308 and to the output terminal of the same, and resistors 303 and 304. The low pass filter removes the chopper frequency component contained in the analog reception signal. A circuit constituted by an operational amplifier 309, bias resistors 310 and 311 and a decoupling capacitor 312 is a bias circuit for generating a bias voltage. The bias voltage is supplied to the gate switch 301 and the operational amplifier 308 via resistors 305 and 306.

Figure 4:
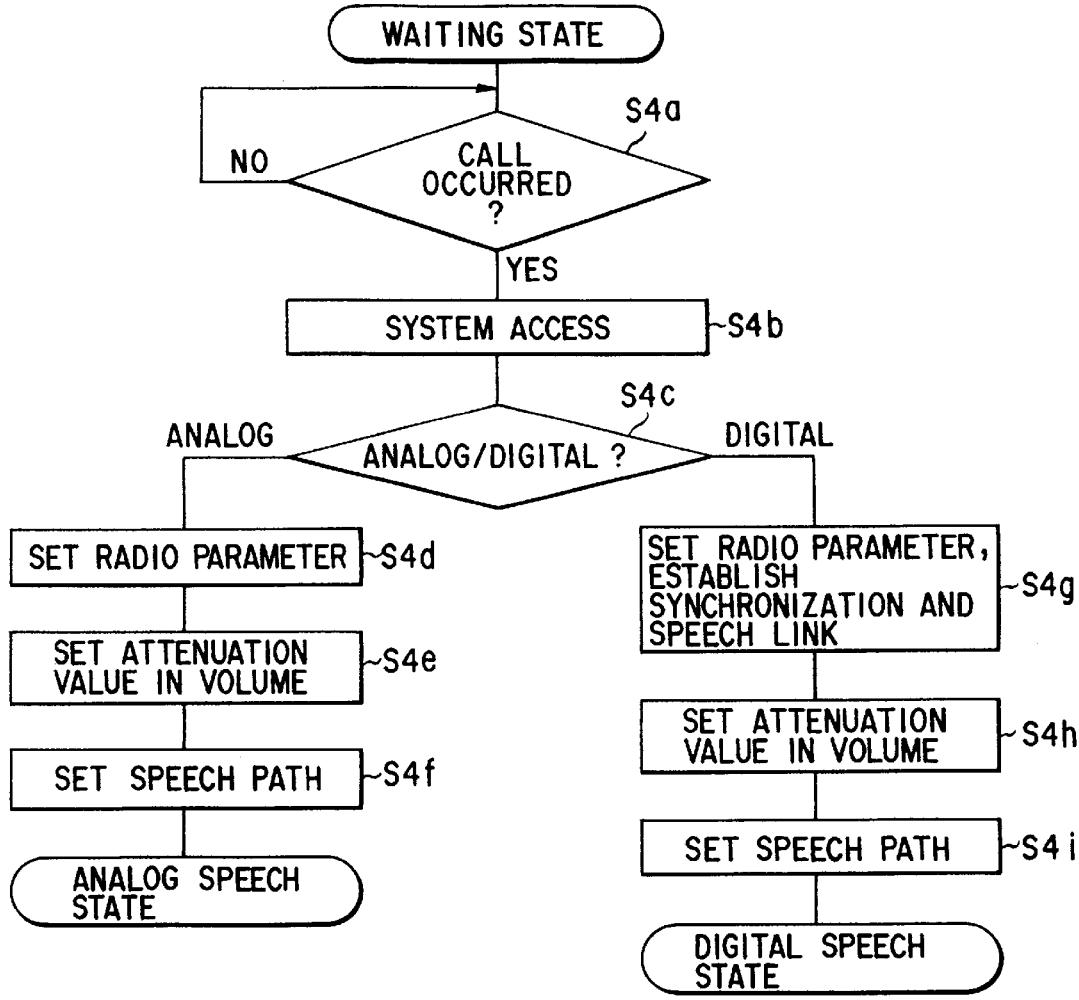
FIG. 4 is a flowchart, showing the order and the contents of gain varying control performed by a radio unit control circuit appearing in FIG. 1.

The operation of the apparatus constructed as above will be explained with reference to the flowchart of FIG. 4.

Where the CPU 2c1 is in a waiting state, it monitors, in a step S4a, occurrence of a call with the use of a paging channel (P-CH). When an operation has been performed to send a call, or when a call has reached, the program proceeds to a step S4b, where system access is performed. In the system access, the channel is shifted from the P-CH to an access channel (A-CH), and various parameters from the base station are received via the A-CH. These parameters include a mode-designating parameter which designates one of the analog mode and the digital mode. The CPU 2c1 determines the mode on the basis of the mode-designating parameter in a step S4c.

If the analog mode is designated, the program proceeds from the step S4c to a step S4d, where radio parameters for the analog mode are set. The set radio parameters include a radio communication channel (T-CH), a transmission power and a SAT signal. Subsequently, the program proceeds to a step S4e, where the attenuation amount-setting data for the analog mode is read from the $E^2$PROM 2d3 in the memory circuit 2, and an instruction to generate a gain control signal in accordance with the read attenuation amount-setting data is supplied to the gate array 2c2. As a result, the gate array 2c2 generates the gain control signal for the analog mode and supplies the same to the volume 29. Thus, the attenuation amount for the analog mode is set in the volume 29.

When the attenuation amount has been set in the volume 29, the program proceeds to a step S4f, where a speech path in the apparatus is set, and then speech control for the analog mode is executed.

On the other hand, if the digital mode is designated, the program skips from the step S4c to a step S4g, where radio parameters for the digital mode are set. The set radio parameters include a radio communication channel, a slot, a CDVCC (Coded Digital Verification Color Code), a transmission power, etc. In the step S4g, control is performed to establish synchronization with the set slot, and speech link.

Subsequently, the program proceeds to a step S4h, where the attenuation amount-setting data for the digital mode is read from the $E^2$PROM 2d3 in the memory circuit 2, and an instruction to generate a gain control signal in accordance with the read attenuation amount-setting data is supplied to the gate array 2c2. As a result, the gate array 2c2 generates the gain control signal for the digital mode and supplies the same to the volume 29. Thus, the attenuation amount for the digital mode is set in the volume 29.

When the attenuation amount has been set in the volume 29, the program proceeds to a step S4f, where a speech path in the apparatus is set, and then speech control for the digital mode is executed.

As described above, in this embodiment, the attenuation amount-setting data for the analog mode and the digital mode are prestored in the $E^2$PROM 2d3 in the memory circuit 2. It is determined in each occasion of communication whether the communication mode is the analog mode or the digital mode. In the case of the analog mode, the attenuation amount-setting data for the analog mode is read from the $E^2$PROM 2d3, thereby setting the attenuation amount for the analog mode in the volume 29. On the other hand, in the case of the mode, the attenuation amount-setting data for the digital mode is read from the $E^2$PROM 2d3, thereby setting the attenuation amount for the digital mode in the volume 29.

As a result, in the embodiment, a variation in the level of a signal FM-demodulated by the discriminator in the analog mode is compensated for by the volume 29, and then the signal is output from the speaker 3a or 4b. Thus, the influence of the FM demodulation by the discriminator upon the level of the demodulation signal can be eliminated in a reliable manner. On the other hand, in the digital mode, the attenuation amount of the volume 29 is set to a predetermined standard level (i.e. to a minimum value=0). Therefore, a reception signal received and reproduced in the digital mode is directly output from the speaker 3a or 4a without being level-controlled by the volume 29. Thus, the output level of the reception signal in the digital mode can be kept constant, which means that the reception speech in the digital mode can have a high quality.

Moreover, since the attenuation value of the volume 29 is automatically set, it is not necessary for the user to adjust the attenuation value by a manual operation in accordance with whether the communication mode is the analog mode or the digital mode. In other words, no complicated operations are necessary.

(Second Embodiment)

This embodiment is an example of a dual mode portable telephone apparatus to which the invention is applied.

FIG. 5 is a schematic block diagram, showing a dual mode portable telephone apparatus according to the second embodiment. In FIG. 5, elements similar to those shown in FIGS. 2A and 2B are denoted by corresponding reference numerals, and no detailed explanation is given thereof.

As is shown in FIG. 5, an analog reception signal output from the PCM-COD 28 is input to the volume 29. The volume 29 has a function for compensating for a level deviation in a signal FM-demodulated by the discriminator, and a function for attenuating the analog reception signal in accordance with the user's volume adjusting operation. The analog reception signal output from the volume 29 is superposed with an alert sound signal by the adder 30, then supplied to the speaker 4a via the low pass filter 31 and the reception signal amplifier 32, and output therefrom.

On the other hand, a transmission signal output from the microphone 4b is amplified by the transmission amplifier 36, and then input to the PCM-COD 28 where the signal is converted to a digital signal. The digital signal is supplied to the DSP 27 to be encoded.

An $E^2$PROM 20d3 incorporated in a memory circuit 20d stores attenuation amount-setting data for setting the amounts of attenuation in the volume 29 in both the analog mode and the digital mode. The attenuation amount in the analog mode is obtained by adding or subtracting an attenuation amount corresponding to the volume of a reception speech which is supposed to be input by the user, to or from a fixed attenuation amount for compensating for a level deviation caused by FM demodulation by the discriminator. Further, the attenuation amount in the digital mode is obtained by adding or subtracting, to or from a minimum attenuation amount (e.g. zero), an attenuation amount corresponding to the volume of a reception speech which is supposed to be input by the user. The user's input of the volume of the reception speech, i.e., the user's volume adjusting operation is performed by pushing a volume adjusting key (VLMCONT) provided in a key input section 40$d$.

The CPU 20$c$1 has a write control function for writing the attenuation amount-setting data, a mode determination function, and a read control function for reading the attenuation amount-setting data. The write control function writes the attenuation amount-setting data for the analog mode and the digital mode in the E$^2$PPROM 20$d$3 in accordance with the attenuation amount-setting operation by the key input section 40$d$. The mode determination function determines whether the communication mode is the digital mode or the analog mode. The read control function selectively reads, from the E$^2$PPROM 20$d$3, attenuation amount-setting data in accordance with a mode determined by the mode determination function and the volume of a reception speech input by means of the volume adjusting key, and supplies the read data to a gate array 20$c$2. The gate array 20$c$2 supplies the volume 29 with a gain control signal corresponding to the read attenuation amount-setting data. Thus, the attenuation amount set in the volume 29 is controlled.

A power supply circuit 20$e$ generates a necessary operation voltage VCC on the basis of the output of a battery 20$f$.

The operation of the apparatus constructed as above will now be explained.

In a waiting state, the CPU 20$c$1 monitors occurrence of a call and input of the attenuation amount-setting data. At this time, suppose that the service man or the user has operated a predetermined function key and a volume adjusting key incorporated in the key input section 40$d$ to input attenuation amount-setting data. Then, the CPU 20$c$ determines whether or not the input attenuation amount-setting data is appropriate, and writes the data in the E$^2$PPROM 20$d$3 if the data is determined to be appropriate. Thus, the user can set a desired attenuation amount in the volume 29.

Thereafter, when the user has operated the apparatus to send a call, or when a call has reached the apparatus, the CPU 20$c$1 determines the mode of the call on the basis of parameters from a base station. If the analog mode is designated, the CPU 20$c$1 reads, from the E$^2$PPROM 20$d$3 of the memory circuit 2$d$, data indicative of a reference value and included in attenuation amount-setting data for the analog mode, and instructs the gate array 20$c$2 to generate a gain control signal in accordance with the read data. As a result, the gate array 20$c$2 outputs a gain control signal for the analog mode to the volume 29, where a reference attenuation amount for the analog mode is set. After setting the attenuation amount in the volume 29, the CPU 20$c$1 sets a speech path in the apparatus and then performs speech control for the analog mode.

If, on the other hand, the digital mode is designated, the CPU 20$c$1 reads, from the E$^2$PPROM 20$d$3 of the memory circuit 2$d$, data indicative of a reference value and included in attenuation amount-setting data for the digital mode (i.e. data indicative of an attenuation amount of zero), and instructs the gate array 20$c$2 to generate a gain control signal in accordance with the read data. As a result, the gate array 20$c$2 outputs a gain control signal for the digital mode to the volume 29, where a reference attenuation amount for the digital mode is set. After setting the attenuation amount in the volume 29, the CPU 20$c$1 sets a speech path in the apparatus and then performs speech control for the digital mode.

Furthermore, suppose that the user has operated the volume adjusting key of the key input section 40$d$. Then, the CPU 20$c$1 reads, in the case of the analog mode, that attenuation amount-setting data for the analog mode from the E$^2$PPROM 20$d$3 of the memory circuit 2$d$, which corresponds to the volume of a reception speech input by means of the volume adjusting key, and instructs the gate array 20$c$2 to generate a gain control signal in accordance with the read data. On the other hand, in the case of the digital mode, the CPU 20$c$1 reads, from the E$^2$PPROM 20$d$3, that attenuation amount-setting data for the digital mode which corresponds to the volume of a reception speech input by means of the volume adjusting key, and instructs the gate array 20$c$2 to generate a gain control signal in accordance with the read data. As a result, the gate array 20$c$2 supplies the volume 29 with a gain control signal corresponding to the attenuation amount-setting data. Thus, an attenuation amount corresponding to the volume of a reception speech input by the volume adjusting operation is set in the volume 29.

In summary, the user can make a call with a desired reception speech volume. Further, since it is not necessary to employ in the apparatus any volume device for adjusting the volume of a reception speech, the apparatus can be made simple in circuit structure.

As described above, also in the second embodiment, a level deviation in a signal FM-demodulated by the discriminator in the analog mode is compensated for by means of the volume 29, and then output from the speaker 4$a$. Thus, the influence of the FM demodulation by the discriminator upon the level of the demodulation signal can be eliminated in a reliable manner. On the other hand, in the digital mode, the attenuation amount of the volume 29 is set to a predetermined standard level. Therefore, a reception signal received and reproduced in the digital mode is directly output from the speaker 4$a$ without being level-controlled by the volume 29. Thus, the output level of the reception signal in the digital mode can be kept at an appropriate value, too.

In addition, since in the second embodiment, the attenuation amount set in the volume 29 can be varied in accordance with a user's reception speech-adjusting operation, the user can make a call with a desired reception speech volume. Further, since it is not necessary to employ in the apparatus any volume device for adjusting the volume of a reception speech, the apparatus can be made simple in circuit structure.

Moreover, voluntary attenuation amount-setting data can be written in the E$^2$PPROM 20$d$3 by the service man or the user by the key operation of the key input section 40$d$. In other words, any optimal data the user wishes can be set.

The invention is not limited to the above-described two embodiments. For example, although in the embodiments, the analog volume 29 is located on the output side of the PCM-COD 28, the volume may be located on the input side of the PCM-COD 28 to compensate for the level of a reception signal by digital signal processing. In this case, the function of the digital volume may be executed by the DSP.

The apparatus may be modified to employ a fixed attenuator having an attenuation amount for the analog mode, and a bypass circuit formed by interposing a switch between the both opposite ends of the fixed attenuator. In this case, the bypass circuit is cut in the analog mode to connect the fixed attenuator to the reception speech signal path, while it is connected to the reception speech signal path in the digital mode to bypass the fixed attenuator.

Also, the apparatus may employ a first attenuator of a fixed attenuation amount for the analog mode, a second attenuator of a fixed attenuation amount for the digital mode, and a switch for selectively connecting one of the first and second attenuators to the reception speech signal path. In this case, the switch switches the connection in accordance with a mode determination result, thereby connecting the first attenuator to the reception speech signal path in the analog mode, and connecting the second attenuator to the reception speech signal path in the digital mode.

A variable gain amplifier may be used as the level variable means. The control procedure and control contents of the gain variable control means, and the type and structure of the radio communication apparatus may be modified without departing from the scope of the invention.

(Other Embodiments)

Each time the apparatus returns to the waiting state after finishing communication, the CPU sets, in the volume, an attenuation amount corresponding to a predetermined mode (the analog mode or the digital mode). In this case, it suffices if the attenuation amount is reset in a later occasion of communication only when the mode has been changed. This means that the control procedure to start communication can be simplified.

Moreover, where the radio communication apparatus has a function for estimating, after finishing the present communication, the performance of a base station which is expected to be a destination of the next communication, and setting one of the analog and digital modes in accordance with the estimation result, the CPU sets, in the volume, an attenuation amount corresponding to the estimated mode. In this case, the probability of changing the mode at the time of the next communication decreases, which further decreases the number of occasions in which it is necessary to reset an attenuation amount in the volume.

Furthermore, where the radio communication apparatus has a function for setting one of the analog mode and the digital mode in accordance with a mode-setting request if it is made by the user while the apparatus is in the stand-by state assumed from the end of the last communication to the start of the next communication, the CPU sets, in the volume, the attenuation amount to a value corresponding to the set mode. In this case, if the user designates a desired communication mode before the start of a communication operation, an attenuation amount corresponding to the designated mode is reset in the volume during a waiting period of time before the start of communication control.

In addition, the apparatus may be modified such that an already set communication mode is compared with a communication mode designated by a destination base station at the time of controlling the start of communication, and that the attenuation amount in the volume is reset to a value corresponding to the designated mode only if both the modes differ from each other. In this case, unnecessary control of setting an attenuation amount can be avoided, with the result that the load on the CPU at the time of starting communication can be reduced.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A radio communication apparatus for use in a dual mode radio communication system which operates in either an analog mode or a digital mode, and communicates with a base station via radio links comprising:

reception speech signal output means for processing an analog demodulation signal in the analog mode and a digital demodulation signal in the digital mode and for outputting the processed demodulation signal as a reception speech signal, respectively;

a speaker for outputting a speech sound corresponding to the reception speech signal output from the reception speech signal output means;

level variable means provided between the reception speech signal output means and the speaker for varying the level of a signal inputted thereto and for outputting a level-varied signal;

mode determination means for determining whether the analog mode or the digital mode is set; and gain variable control means for setting the gain of the level variable means to a first value when the mode determination means determines that the analog mode is set, and for setting the gain of the level variable means to a second value when the mode determination means determines that the digital mode is set.

2. The radio communication apparatus according to claim 1, wherein the gain variable control means includes:

a memory for storing data indicative of the first value and data indicative of the second value; and read control means for selectively reading from the memory the data indicative of the first and second values, in accordance with the determination result of the mode determination means, and for setting in the level variable means a gain corresponding to the data read by the read control means.

3. The radio communication apparatus according to claim 2, further comprising memory data change control means for changing the data indicative of the second value stored in the memory in response to a key operation.

4. The radio communication apparatus according to claim 1, further comprising volume designation means for designating a reception speech volume, and wherein the gain variable control means adjusts, on the basis of the reception speech volume designated by the volume designation means, the first value when the mode determination means determines that the analog mode is set, and the second value when the mode determination means determines that the digital mode is set, and for setting the gain of the level variable means to the value adjusted by the gain variable control means.

5. The radio communication apparatus according to claim 4, wherein the gain variable control means includes:

a memory for storing first gain data items indicative of values obtained by adjusting the first value, and second gain data items indicative of values obtained by adjusting the second value;

read control means for selectively reading, in the analog mode, one of the first gain data items stored in the memory, which corresponds to the reception speech volume designated by the volume designation means, and in the digital mode, one of the second gain data items stored in the memory, which corresponds to the reception speech volume designated by the volume designation means; and gain-setting means for setting in the level variable means a gain corresponding to the gain data item read from the read control means.

6. The radio communication apparatus according to claim 1, wherein the level variable means includes:

a level variable circuit having its gain fixed to the first value;

a bypass circuit provided parallel to the level variable circuit; and a switch circuit for connecting one of the level variable circuit and the bypass circuit between the reception speech signal output means and the speaker;

the gain variable control means controlling the switch circuit in accordance with a determination result of the mode determination means to connect between the reception speech signal output means and the speaker the level variable circuit in the analog mode and the bypass circuit in the digital mode.

7. The radio communication apparatus according to claim 1, wherein the level variable means includes:

a first level variable circuit having its gain fixed to the first value;

a second level variable circuit having its gain fixed to the second value; and a switch circuit for connecting one of the first and second level variable circuits between the reception speech signal output means and the speaker;

the gain variable control means controlling the switch circuit in accordance with a determination result of the mode determination means to connect one of the first and second level variable circuits between the reception speech signal output means and the speaker.

8. The radio communication apparatus according to claim 1, wherein the gain variable control means sets the gain of the level variable means to the value corresponding to predetermined one of the analog and digital modes, each time communication is finished.

9. The radio communication apparatus according to claim 1, wherein the radio communication apparatus has a function for estimating, after finishing present communication, the performance of a base station which is expected to be a destination of next communication, the setting one of the analog and digital modes in accordance with the estimation result, and the gain variable control means sets the gain of the level variable means to the value corresponding to the set mode before the start of next communication.

10. The radio communication apparatus according to claim 1, wherein the radio communication apparatus has a function for setting one of the analog mode and the digital mode in accordance with a mode-setting request if the mode-setting request is made by the user while the apparatus is in a stand-by state assumed from the end of last communication to the start of next communication, and the gain variable control means sets the gain of the level variable means to the value corresponding to the set mode before the start of the next communication.

11. The radio communication apparatus according to claim 1, wherein the gain variable control means compares an already set mode with a mode designated by a destination base station at the time of controlling the start of communication, and sets the gain of the level variable means to the value corresponding to the designated mode when both the compared modes differ from each other.

12. A radio communication apparatus for use in a dual mode radio communication system that operates in either an analog mode or a digital mode, and communicates with a base station over radio links, the apparatus comprising:

reception speech signal output means for processing a first demodulated signal in the analog mode and a second demodulated signal in the digital mode and for outputting one of the processed demodulated first and second signals as a reception speech signal;

a speaker for outputting a speech sound corresponding to the reception speech signal output from the reception speech signal output means;

level variable means, provided between the reception speech signal output means and the speaker, for varying the level of a signal from the reception speech signal output means and for outputting the level-varied signal to the speaker;

mode determination means for determining whether the analog mode or the digital mode is set; and gain variable control means responsive to the mode determination means for setting the gain of the level variable means to a first value when the analog mode is set, and for setting the gain of the level variable means to a second value when the digital mode is set.

13. The radio communication apparatus according to claim 12, wherein the gain variable control means includes:

a memory for storing data indicative of the first value and data indicative of the second value; and read control means for selectively reading from the memory the data indicative of the first and second values, in accordance with the determination result of the mode determination means, and for setting in the level variable means a gain corresponding to the data read by the read control means.

14. The radio communication apparatus according to claim 12, wherein the level variable means includes:

a level variable circuit having its gain fixed to the first value;

a bypass circuit provided parallel to the level variable circuit; and a switch circuit for connecting one of the level variable circuit and the bypass circuit between the reception speech signal output means and the speaker;

the gain variable control means controlling the switch circuit in accordance with a determination result of the mode determination means to connect between the reception speech signal output means and the speaker the level variable circuit in the analog mode and the bypass circuit in the digital mode.

15. The radio communication apparatus according to claim 12, wherein the level variable means includes:

a first level variable circuit having its gain fixed to the first value;

a second level variable circuit having its gain fixed to the second value; and a switch circuit for connecting one of the first and second level variable circuits between the reception speech signal output means and the speaker;

the gain variable control means controlling the switch circuit in accordance with a determination result of the mode determination means to connect one of the first and second level variable circuits between the reception speech signal output means and the speaker.

16. The radio communication apparatus according to claim 12, wherein the gain variable control means sets the gain of the level variable means to the value corresponding to predetermined one of the analog and digital modes, each time communication is finished.

17. The radio communication apparatus according to claim 12, wherein the radio communication apparatus has a function for estimating, after finishing present communication, the performance of a base station which is expected to be a destination of next communication, and setting one of the analog and digital modes in accordance with the estimation result, and the gain variable control means sets the gain of the level variable means to the value corresponding to the set mode before the start of next communication.

18. The radio communication apparatus according to claim 12, wherein the radio communication apparatus has a function for setting one of the analog mode and the digital mode in accordance with a mode-setting request if the mode-setting request is made by the user while the apparatus is in a stand-by state assumed from the end of last communication to the start of next communication, and the gain variable control means sets the gain of the level variable means to the value corresponding to the set mode before the start of the next communication.

19. The radio communication apparatus according to claim 12, wherein the gain variable control means compares an already set mode with a mode designated by a destination base station at the time of controlling the start of communication, and sets the gain of the level variable means to the value corresponding to the designated mode when both the compared modes differ from each other.

* * * * *